United States Patent [19]

Naden

[11] 4,354,253
[45] Oct. 12, 1982

[54] BUBBLE REDUNDANCY MAP STORAGE USING NON-VOLATILE SEMICONDUCTOR MEMORY

[75] Inventor: Rex A. Naden, Richardson, Tex.

[73] Assignee: Texas Instruments Incorporated, Dallas, Tex.

[21] Appl. No.: 752,947

[22] Filed: Dec. 17, 1976

[51] Int. Cl.³ .............................................. G11C 19/08
[52] U.S. Cl. ...................................... 365/15; 364/900
[58] Field of Search .................. 340/174 TF, 173 BB; 364/200 MS File, 900 MS File; 365/1, 15, 200

[56] References Cited

U.S. PATENT DOCUMENTS

| | | | |
|---|---|---|---|
| 3,755,791 | 8/1973 | Arzubi | 365/200 |
| 3,909,810 | 9/1975 | Naden et al. | 340/174 TF |
| 4,070,651 | 1/1978 | Naden | 365/15 |
| 4,073,012 | 2/1978 | Ohnigian et al. | 365/1 |
| 4,090,251 | 5/1978 | Flannigan et al. | 365/15 |

*Primary Examiner*—James W. Moffitt
*Attorney, Agent, or Firm*—William E. Hiller; Melvin Sharp; James T. Comfort

[57] ABSTRACT

A magnetic domain memory system is provided that includes magnetic domain data chips having a major-minor loop organization wherein the system may include data chips having one or more defective minor loops. An erasable non-volatile semiconductor memory device is provided to record locations of defective minor loops for each chip in the system. In order to update the defective minor loop locations when a data chip is replaced a random access memory is provided to store the present map of locations and substitute data designating the new defective minor loops. A method of replacing the map in the erasable non-volatile semiconductor memory is also disclosed. An array of binary one bit data in the form of "1" or "0" is stored in the non-volatile semiconductor memory to designate defective and operative minor loops.

15 Claims, 5 Drawing Figures

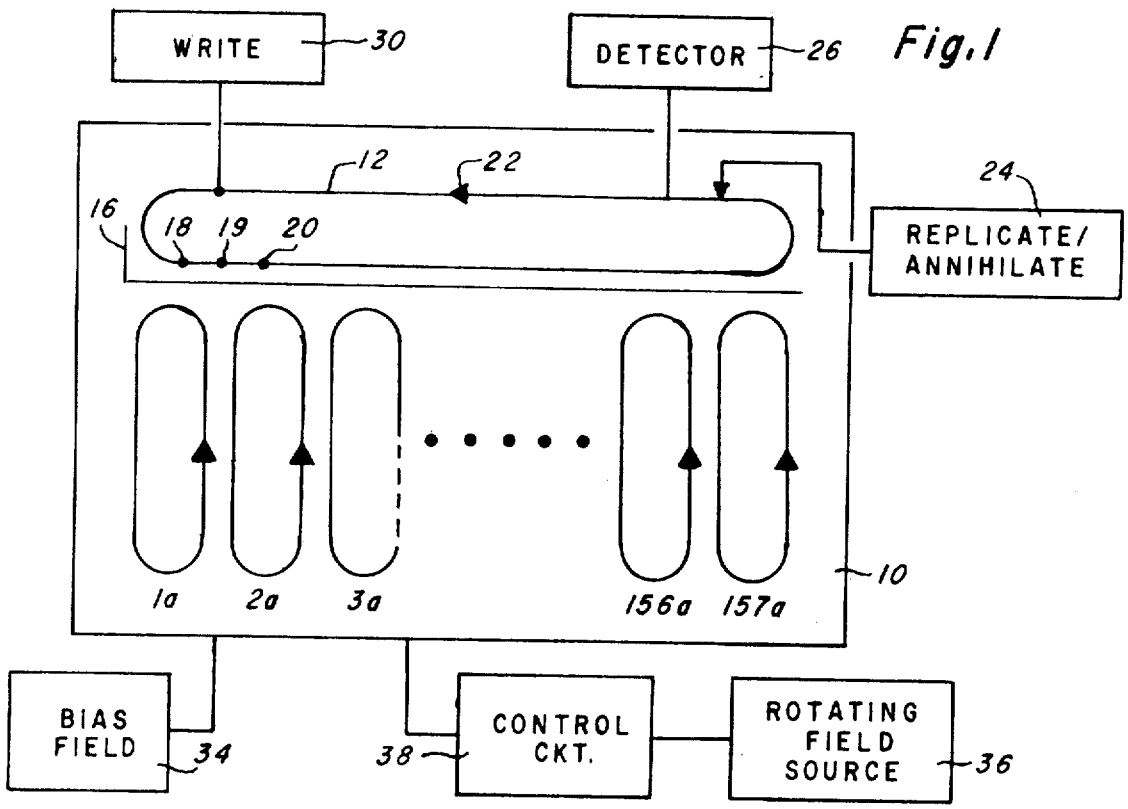

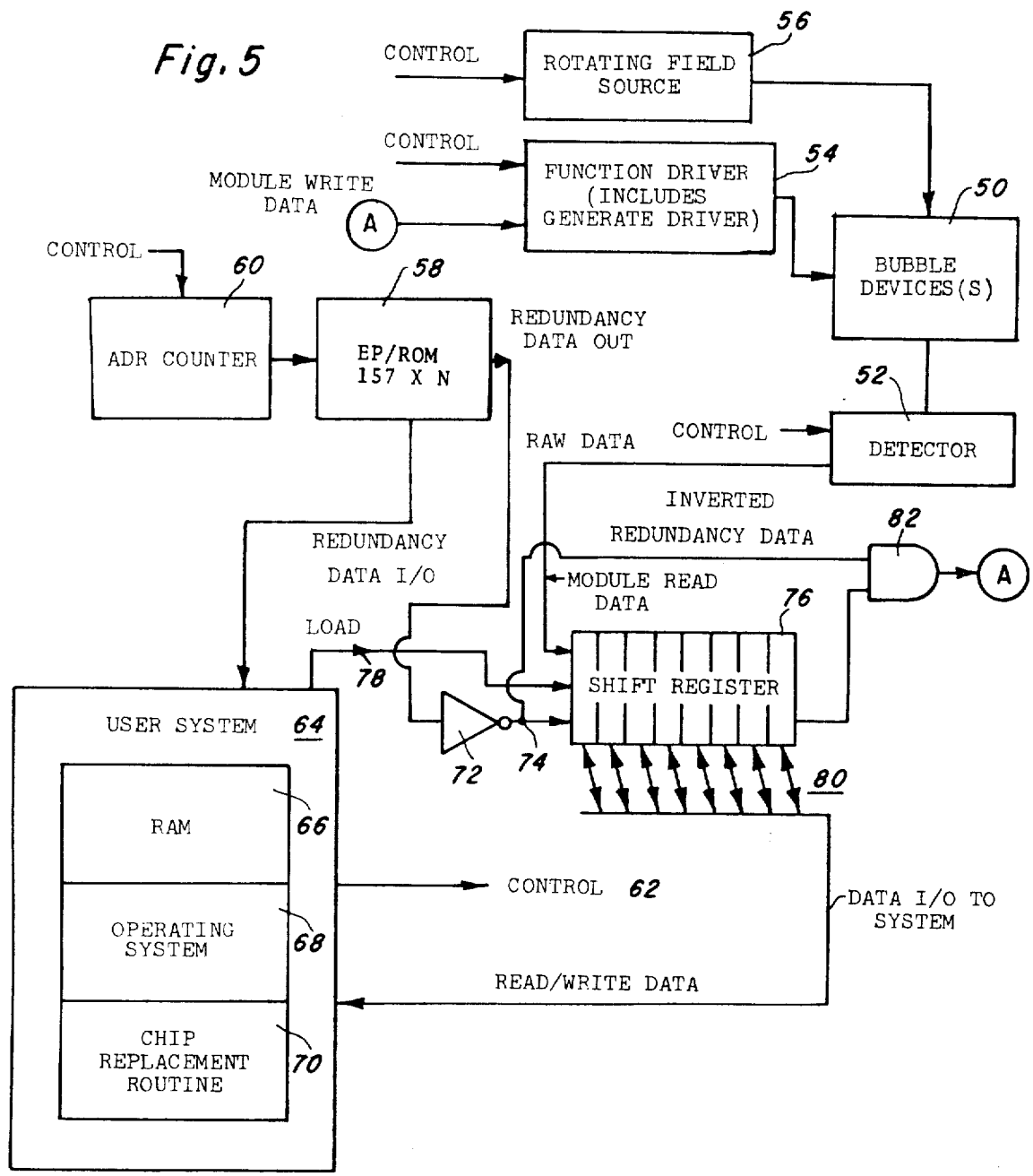

BUBBLE REDUNDANCY MAP STORAGE USING NON-VOLATILE SEMICONDUCTOR MEMORY

BACKGROUND OF THE INVENTION

The present invention pertains to magnetic domain memory devices and more particularly to a system which permits utilization of magnetic domain chips having one or more defective portions which are incapable of propagating magnetic domains.

In recent years tremendous progress has been made in developing equipment for electronic data processing such that today high speed reliable hardware is available to the data processing designer. The newly developed electronic components, particularly those using integrated circuits, have greatly increased the capacity of modern electronic data processing equipment to process data. As the speed and capacity of processing has increased, the data storage requirements have also increased. At present several different techniques exist for storing large quantities of digital data including punched cards, punched tape, magnetic tape, magnetic drums, magnetic disc, and magnetic cores. In all of these types of storage, with the exception of magnetic cores and their solid state storage counterparts, a relatively long period of time is required for accessing any particular bit of data.

On the other hand, with random access type memories such as provided with magnetic cores and their semiconductor counterparts, any particular bit or word stored in the memory can be retrieved extremely fast, the time required to read any stored bit of information being only the time required for the electronic circuits to operate. However, increased speed has also resulted in increased costs. As a consequence, considering in general the memories discussed above, the cost per bit of information stored is cheapest with the slowest devices and most expensive with the fastest devices. Accordingly, there has been an effort to develop large capacity memories which are characterized by a large data access time but which are less expensive than magnetic cores and solid state storage configurations.

In this regard, significant interest has developed recently in a class of magnetic devices generally referred to as magnetic domain devices or "magnetic bubbles". These devices are described, for example, in *IEEE Transactions on Magnetics*, Vol. MAG—5, No. 3 (1969), pp. 544-553, "Application or Orthoferrites to Domain-Wall Devices". These magnetic domain devices are generally planar in configuration and are constructed of materials which have magnetically easy directions which are essentially perpendicular to the plane of the structure. Magnetic properties such as magnetization anisotropy, coercivity, and mobility, are such that the device may be maintained magnetically saturated with magnetization in a direction out of the plane and that small localized single domain regions of magnetic polarization aligned opposite to the general polarization direction may be supported. Such localized regions which are generally cylindrical in configuration represent binary memory bits. Interest in these devices in large part is based on the high density that can be obtained and the ability of the cylindrical magnetic domains to be independent of the boundary of the magnetic material in the plane in which it is formed and hence they are capable of moving anywhere in the plane of the magnetic material to effect various data processing operations.

A magnetic domain can be manipulated by programming currents through a pattern of conductors positioned adjacent the magnetic material or by varying the surrounding magnetic field. As an example, the magnetic domains may be formed in thin platelets having uniaxial anisotropy with the easy magnetic axis perpendicular to the plate comprising such material as rare earth orthoferrites, rare earth aluminum and gallium substituted iron garnets and rare earth cobalt or iron amorphous alloys. Since the magnetic bubbles can be propagated, erased, replicated and manipulated to form data processing operations and their presence and absence detected, these bubbles may be utilized to perform the primary functions vital to memory operation.

Many structural organizations of operable magnetic domains have been disclosed in the literature. One of the most popular is the major-minor memory organization disclosed in U.S. Pat. No. 3,618,054. The major-minor loop memory organization as well as its implementation and operation is well known in the art. The major-minor loop organization includes a closed major loop which typically is established by an arrangement of T-bar permalloy circuits on, for example, a rare earth orthoferrite platelet. The magnetic domains are propagated around the loop by in-plane rotating magnetic field action. The major loop is generally elongated to permit a number of minor loops to be aligned along side it. Two way transfer gates permit the transfer of magnetic domains from the minor loop to the major loop and from the major loop to a minor loop. Further access to the major loop is achieved by a detect and read connection thereto and by a separate write connection.

The organization above described permits a synchronized domain pattern since propagation in the loops is synchronous with the rotation of the in-plane field. That is, parallel transfer of data domains from a plurality of minor loops may be made simultaneously to the major loop. Moreover, a plurality of data chips, each with a major loop and a plurality of associated minor loops, may be treated together. It is common to arrange such data chips in rows and then even to stack rows of data chips in time multiplexed layers to achieve complex memory structures, the data domains in all the loops and all the chips being synchronized with in-plane rotations.

Typically, all of the minor loops in the chip, upon command, transfer in parallel the bubbles from their corresponding positions to the major loop. The bubbles are then serially detected as they are propagated past a read position. New data may also be inserted at a write position for parallel transfer back into the minor loops at an appropriate time later (when major loop magnetic domain propagation aligns the data for transfer).

Simultaneous reading/writing of data into a grouping of related major loops gives the capacity of treating related magnetic domains as digital or other coded words. Time multiplexed groups of data chips permits reading and writing of data in a time sharing fashion to permit an overall memory data rate greater than that permitted by magnetic domain propagation in a single chip.

Although a bubble memory system employing major-minor loops of the type described has numerous economic and operational advantages, unless special provision is made, every loop in every chip of the system must be perfect for the system to perform in a satisfactory manner. Since chips contain entire groupings of registers, a defect in one of the minor loops would require discarding the entire chip. Various techniques have been proposed in the art for permitting use of a magnetic domain chip even though one or more of its minor loops may be defective. Exemplary techniques are described, for example, in U.S. Pat. No. 3,909,810, entitled "Bubble Memory Minor Loop Redundancy Scheme", which is assigned to the assignee of the present invention and "Fault-Tolerant Memory Organization: Impact on Chip Yield and System Cost", *IEEE Transactions Magnetics*, September, 1974. These techniques utilize a magnetic domain chip to store locations of defective loops. This technique, that is storing defective loop locations on a magnetic domain chip, is subject to loss of accuracy with time and it would be advantageous if defective loop location information could be stored in a non-volatile semiconductor memory.

A further example of techniques to overcome this deficiency is found in co-pending patent application Ser. No. 594,901, filed July 10, 1975, now U.S. Pat. No. 4,070,651 issued Jan. 24, 1978. The technique described therein is an important step in development of a system using data chips with defective minor loops. Generally, what is disclosed is using a non-volatile semiconductor memory such as a programmable read-only-memory to store the relative positions of defective minor loops to each other. This data is used to control logic so that a stream of data bubbles to be transferred into the minor loops for storage, for example, contain intermittent voids corresponding to defective minor loop locations. Although the invention disclosed in the aforesaid patent application Ser. No. 594,901, now U.S. Pat. No. 4,070,651, is advantageous over the technique of storing the defective minor loop locations in a magnetic domain chip, it stops short of allowing flexibility in data chip replacement without the cumbersome procedure of removing the obsolete programmable read-only-memory and replacing it with a newly programmed unit each time a bubble chip is replaced in the system. This method includes manually addressing the programmable read-only device with data representing the locations for all defective minor loops in the system and not just those on the new chip.

A further problem inherent in the device disclosed in the above application (Ser. No. 594,901), now U.S. Pat. No. 4,070,651, is the loss of additional minor loops where the number of adjacent perfect minor loops exceeds fifteen. In that system the maximum binary digit that could be stored was a four bit word and resulted in a maximum number of '1111' or fifteen which told the logic to skip fifteen good loops and prevent data from being stored in the next minor loop.

SUMMARY OF THE INVENTION

In accordance with the present invention it is proposed to use an erasable non-volatile semiconductor memory device for recording the locations of defective areas on a thin magnetic film capable of supporting magnetic domains. Since these defective areas are not capable of propagating magnetic domains it is desirable to inhibit data from being stored therein. An array of one bit binary "1"'s and "0"'s are stored in the erasable non-volatile memory device and designating defective and operative areas on the magnetic film enabling the system to utilize magnetic memory devices having defective areas.

A preferred magnetic domain memory system in accordance with the present invention includes a plurality of data chips each with a major loop, a plurality of minor loops, and transfer gates therebetween. The major-minor loop chip concept is not limited to the referenced arrangement disclosed in U.S. Pat. No. 3,618,054 but rather the concept is applicable to all memories comprised of multiple data loops which communicate with serial input/output tracks at at least one point on each data loop. Means, such as a rotating in-plane magnetic field, propagates the magnetic domains around the loops and pulsed conductor means are used to transfer the magnetic domains through the transfer gates on command. Each data chip contains at least one extra minor loop to provide redundancy in case there are one or more faulty or defective minor loops in the data chip. In a specific embodiment of the present invention the non-volatile semiconductor memory device is coupled to a volatile random access memory, RAM, enabling the user to replace data chips and update the locations of the inoperable minor loops of the replacement chip.

A method for replacing data chips and updating the erasable non-volatile semiconductor memory device in accordance with the present invention comprises, reading the old non-volatile semiconductor memory contents into the volatile RAM and subsequently erasing the non-volatile semiconductor memory, updating the RAM with the new defective loop locations and writing the new data to the non-volatile semiconductor memory device.

BRIEF DESCRIPTION OF THE DRAWINGS

FIG. 1 is a diagram partly in block form and partly in schematic form of a data chip employed in a magnetic domain memory system in accordance with the present invention;

FIG. 2 is a block diagram illustration of an erasable non-volatile semiconductor memory device used in accordance with the present invention for preventing transfer of data between defective minor loops and the major loop of data chips in a memory system which includes modules of single data chips;

FIG. 5 is a diagram partly in block form and partly in schematic form illustrating an embodiment of the present invention using an erasable programmable read-only-memory and a RAM for storing and updating defective minor loop data.

DETAILED DESCRIPTION

Figure 3:
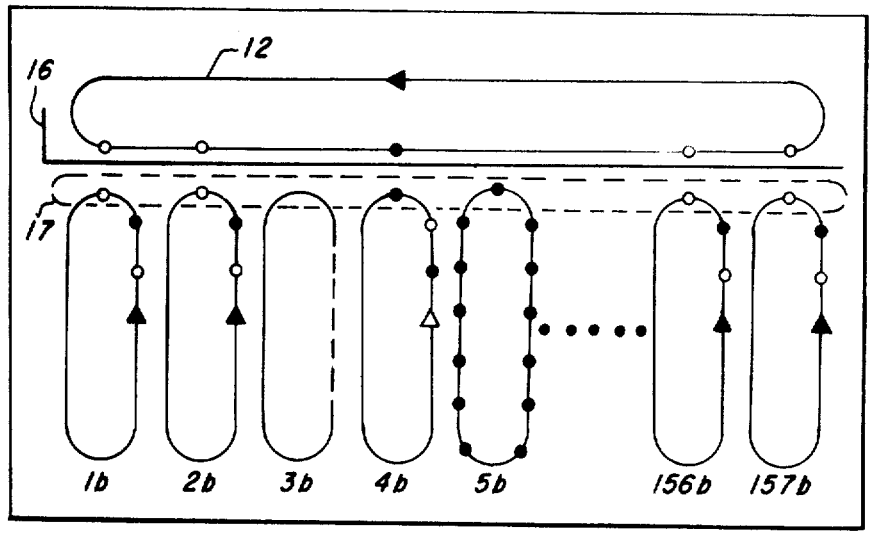
FIG. 3 is a schematic diagram illustrating one method of storing defective minor loop data on the data chip.

Referring now to the drawings and for the present particularly to FIG. 1, a major-minor magnetic domain memory organization is illustrated. Except for the presence of an illustrated defective minor loop, it is similar to the organization shown in U.S. Pat. Nos. 3,613,056, 3,618,054 and 3,729,726. The conditions for establishing single wall magnetic domains in suitable material 10 such as a rare earth orthoferrite platelet or a rare earth iron garnet film grown on a nonmagnetic substrate are well known in the art. One article on the subject is the previously mentioned article appearing in the *IEEE Transactions of Magnetics*, Vol. MAG 5—No. 3, 1969, pp. 544–553, hereby incorporated by reference. Patterns of magnetically soft overlay material (not shown), such as permalloy, shaped in bar and T-shaped segments are commonly employed to determine the loop pattern. One loop identified as major loop 12 closes on itself so that magnetic domains established in the loop circulate indefinitely provided they are not annihilated or transferred out.

Aligned adjacent minor loop 12 are a series of identical minor loops 1a, 2a, 3a . . . 156a, 157a. Minor loop 3a is illustrated as having a defect as indicated by the broken line. For illustrative purposes, 157 minor loops have been shown although any number may be selected as desired for specific applications. Let us assume that the application requires 144 good minor loops, leaving room for only thirteen defective loops. One portion of each minor loop (that portion nearest to the major loop 12) acts as part of a two-way port or transfer gate 16 with the major loop. Transfer of domains through the loop may be accomplished by pulsing transfer line 16 which contains in a serially connected fashion all of the transfer gates between minor loops 1a-157a and the major loop 12.

A transfer pulse applied to transfer line 16 causes magnetic domains or the absence of magnetic domains to pass from all of the minor loops to the major loop 12 simultaneously. This parallel transfer signifies the transfer of a related data segment; i.e., word. In a similar manner, by altering the pulse current and timing, data may be transferred from the major loop in parallel back into the minor loops. As illustrated it will be observed that there is a data position between each of the magnetic domains transferred to the major loop; for example, bubble position 18 is shown opposite minor loop 1a, bubble position 19 is shown between loops 1a and 2a on the major loop and bubble position 20 is shown opposite minor loop 2a. Bubble positions 18, 19 and 20 are consecutive bubble positions on the major loop 12.

Once in the major loop 12, magnetic domains are circularly propagated in counter clockwise direction 22 by an in-plane rotating magnetic field, each rotation signifying four steps in the T-bar advancement sequence as described, for example, in the U.S. Pat. No. 3,618,054. Replicate/annihilate means 24 may be attached to the major loop at a convenient position normally along the loop between the point at which magnetic domains propagate past the last of the minor loops, loop 157a, and before the point at which they are reintroduced into the first of the minor loops 1a.

Also connected to the major loop 12 is a detector circuit 26 and further a write circuit 30. The detector circuit 26 may be used to monitor the magnetic domain data sequence passing the point of the major loop 12 to which connection is made via the replicate function. The write circuit 30 can supply new data information as desired into the major loop 12 at the point where its connection is made.

A bias field supplied by the source 34 maintains single wall domains in the material 10 at nominal operating size as is well known. A rotating field source 36 may, for example, cause movement of the domains to occur in a counter clockwise direction such as the direction 22 of the domains in the major loop 12. As previously described, this movement occurs simultaneously in all loops. Finally the rotating field source 36 is under the control of control circuit 38 for activation and synchronization. The bias source 34, control circuit 38, rotating field source 36, and other auxiliary circuits such as a pulsing circuit for application to transfer line 16, counter circuits for tracking the magnetic domains in the loops and etc., are well known. Although not specifically illustrated in each case, such exemplary circuits may be used in connection with the illustrated embodiments as desired.

With reference now to FIG. 2, a series of N magnetic memory modules 40 is shown. Each module is made up of a single data chip, as the chip described in FIG. 1 above, for example. In each of these chips there are 157 minor loops, shown as minor loops 1a-157a in FIG. 1.

Although any number of operative minor loops may be necessary for a given application, it is generally true that for a chip to be effective at least 144 out of 157 minor loops must be perfect. This results in a maximum of 13 defective minor loops on a good chip. It is necessary to prevent data from being stored in those defective minor loops incapable of propagating magnetic domains. As previously noted there are several techniques for accomplishing this result, one of which stores the locations of defective loops on a magnetic memory device and another that stores the locations in a programmable read-only-memory described in U.S. patent application Ser. No. 594,901, now U.S. Pat. No. 4,070,651.

A block diagram is shown in FIG. 2 representing an erasable non-volatile semiconductor memory 42 as an Ep/ROM (erasable programmable read-only-memory). This type of memory device will retain information stored therein after power shutdown. The size of the Ep/ROM will depend on the amount of storage desired which in the present diagram is 157×N modules. What is being stored in the Ep/ROM 42 associated with the series of magnetic memory modules 40 is an array of one bit binary data corresponding to each of the minor loops in each of the data chips. Module 1 for example has its 157 minor loops represented by a bit string of binary "1"'s and "0"'s at address 1 in the Ep/ROM 42. It is determined before storage whether the 1 or 0 represents a good or bad loop, and for purpose of this description a binary "1" will represent a defective minor loop. Thus if module 1 consisted of the data chip described in FIG. 1 the array would be all "0"'s except at the third position where a 1 would appear to designate the defective minor loop 3a. A suitable erasable programmable read-only-memory is marketed by American Microsystems, Santa Clara, California, Model 56834.

Figure 4:
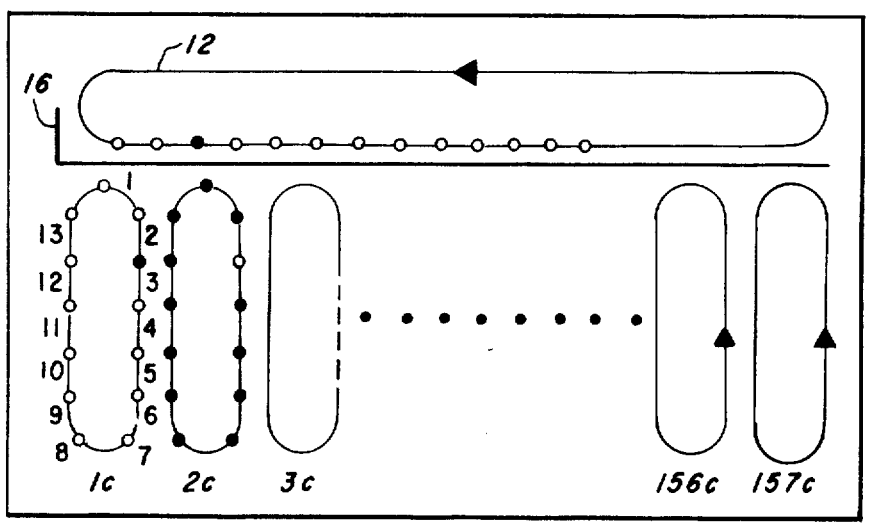
FIG. 4 is a schematic diagram illustrating a further method of storing defective minor loop data on the data chip.

With reference to FIGS. 3 and 4 there will be described two configurations for storing the map representing the defective minor loop locations on the data chip itself in its initial state, for programming the Ep/ROM. Although storing a redundancy map, i.e., data representing good and bad minor loops in a magnetic memory system, in a programmable read-only-memory as disclosed in U.S. patent application Ser. No. 594,901, now U.S. Pat. No. 4,070,651, in order to replace any given data chip in a memory system a new programmable read-only-memory was necessary since a new redundancy map including the defective minor loops for the new chip was required. Using the Ep/ROM as set out in FIG. 2 enables the user to erase the contents and store an updated redundancy map upon replacement of the bubble chip. A method of accomplishing this result along with the apparatus to perform the method will be discussed with respect to FIG. 4.

In order to effectively update the Ep/ROM redundancy map with the locations of the defective minor loops in the new chip it is convenient to store this information on the new chip, transferring the data at start-up of the memory system. Two schemes for storing this on-chip data are shown in FIGS. 3 and 4. FIG. 3 illustrates storing the data chip redundancy map by writing a "1" or "0" represented by the presence or absence of a magnetic domain into the first position of each minor loop. The collection of 157 bits is called a page 17. This data is then transferred into the major path 12 and used to update the Ep/ROM array. The chip shown in FIG. 3 has defective minor loop 3b which is incapable of storing data. Also shown is loop 5b which cannot store correct data but which may erroneously become filled with bubbles. In order to allow checking of the accuracy of the redundancy map the complement of the map is stored in alternate pages with the map itself.

FIG. 4 illustrates another configuration of on-chip redundancy map storage for updating the Ep/ROM at start-up of the memory system. In this configuration the redundancy map is stored in its entirety in the first good minor loop 1c. In FIG. 4 for convenience thirteen pages are shown in minor loop 1c representative only of the one hundred and fifty seven needed. Since there is a need for an accuracy check the complement of the redundancy map is stored in the next operative minor loop 2c where a software routine check in the user system (not shown) determines the accuracy of the data.

It will be understood that the configurations shown in FIGS. 3 and 4 are for purposes of illustration only and that any configuration of data storage on a data chip can be used with the present invention. Referring now to FIG. 5, the magnetic bubble device 50 may be a series of N data chips similar to the data chip 10 shown in FIG. 1 in the major-minor loop configuration. The magnetic bubble device 50 is coupled to a magnetic domain detector device 52, such as the sense amplifier marketed by Motorola Company, Phoenix, Arizona, Model MCL444L, which senses the presence or absence of a magnetic domain. Magnetic bubble device 50 is also coupled to a function driver including generator 54, for generating magnetic domains and writing them into the bubble device 50, and a rotating field source 56 for propagating the magnetic domains around the major loop. Both the generator 54 and rotating field source 56 are well known in the art.

After a magnetic domain is detected a determination must be made as to whether the data was obtained from a defective minor loop in the magnetic bubble device 50. A bit string of 157 bits is stored for every data chip in the Ep/ROM 58, with a binary "1" designating defective minor loops as demonstrated in FIG. 2. The Ep/ROM 58 is coupled to an address counter 60, Model S.N. 74191 marketed by Texas Instruments Inc., Dallas, Texas, for inputting the Ep/ROM 58 signals for selecting addresses in a sequential manner. The address counter 60, generator 54, rotating field source 56 and detector 52 are all also coupled to a control circuit 62, which receives instruction from a central user system 64 concerning read and write operation for individual data chips. The user system 64 comprises a volatile memory, as the random access memory (RAM) 66 shown, an operating system 68 and the data chip replacement routine 70, as shown in FIG. 5.

Operationally, the user system 64 through commands from its operating system 68 will send signals by way of control circuit 62 to instruct the bubble device 50 and its peripheral circuitry whether to read out magnetic domains or accept new domains for storage therein. For a read instruction the control circuit 62 will designate which data chip is to be accessed and the detector 52 senses the presence or absence of a magnetic domain as each page of information is read out of the major path.

At the same time the raw data is being read out of the bubble device 50, the control circuit 62 instructs the address counter and a bit string of data is accessed from the Ep/ROM 58 output. The Ep/ROM output is coupled to a HEX inverter 72, as Model S.N. 7404 marketed by Texas Instruments Inc., Dallas, Texas. If the data is being accessed from a chip similar to that of FIG. 1, the first three bits of data would be 001 designating the third minor loop defective. At point 74 in the circuit, after being inverted, the bit string would be 110 which when applied to the shift register 76, as Model S.N. 74S299 manufactured by Texas Instruments Inc., Dallas, Texas, simultaneously with the raw data from the bubble device 50, will inhibit the data from the third minor loop from being entered into the shift register 76, only pulsing the data when a binary "1" is delivered. When the shift register 76 is full a load signal 78 is sent to transfer the data to the user system 64 by way of parallel data bus 80.

For a write instruction from the user system 64, the data to be stored in the bubble device 50 is delivered to shift register 76 by way of parallel data bus 80. Control signals are also sent from the user system 64 to the function and generate driver 54, rotating field source 56 and address counter 60 to instruct the system as to which data chips are to be used for storage. The address counter 60 signals the Ep/ROM 58 and the appropriate data chip bit strings are accessed. Again using a sample chip as in FIG. 1 the bit string will be 110 for the first three minor loops at the output of inverter 72. The inverted bit string is then fed into one input of an AND logic gate 82, such as Model S.N. 7408 manufactured by Texas Instruments Inc., Dallas, Tex., while the data in the shift register 76 is transferred one bit at a time to the second input of the AND logic gate 82. In the present example when the first input from the bit string 110 is a binary "0" a void is written into the defective loop by generator 54 which is coupled to the AND logic gate 82, shown by the circled letter A designation, and thus that minor loop is effectively skipped over. When the data is a binary "0" at the second input, a void will be generated and written into an operative minor loop.

In any one of the data chips comprising bubble device 50 is found to be defective and needs replacement, the redundancy map stored in Ep/ROM must be updated since the new data chip will have a different set of defective minor loops. A method for updating the Ep/ROM at the user location is accomplished using the embodiment of the present invention shown in FIG. 5, for example.

After the new data chip is physically placed in the system with its defective minor loop locations stored in its own minor loops as in one of the configurations shown in FIG. 2, for example, the user will initiate a chip replacement routine 70 to implement the new redundancy map into Ep/ROM 58. The first step in map replacement is to read the contents of Ep/ROM 58 into a RAM 66 (random access memory) of the volatile type marketed by Texas Instruments Inc., Dallas, Tex. Model TMS4050. The Ep/ROM 58 is then erased of its redundancy data. The operating system 68 sends read instructions as described above by way of control circuit 62 to access the data stored in the minor loops of the new data chip. This information is fed into user system 64 and used to update the RAM 66 contents corresponding to the location of the new data chip in the array of defective minor loop data. This updated array is then read back into the Ep/ROM 58 and the system is now ready for operation with the new redundancy map in place.

While the present invention has been described in relation to specific embodiments, and methods, it should be apparent to those skilled in the art that various modifications may be made without departing from the spirit and scope of the present invention.

I claim:

1. A magnetic domain memory system including
   at least one thin magnetic film capable of supporting magnetic domains; and
   control means operably associated with said film to impart movement to said magnetic domains in said film from one storage position to another storage position;
   said film including at least one defective portion such that magnetic domains cannot be controllably moved or positioned therein;
   an erasable non-volatile memory element for recording locations of said at least one defective portion;
   up-dating means for containing information as to locations of defective portions on a particular magnetic film;
   said erasable non-volatile memory element being electrically coupled to said control means for providing signals thereto effective to prevent the use of any defective portions for memory storage; and
   said up-dating means being coupled to said erasable non-volatile memory element, the contents of said erasable non-volatile memory element being erasable for replacement by current information from said up-dating means as to locations of defective portions on a particular magnetic film upon replacement of the magnetic film formerly in use by said particular magnetic film.

2. A magnetic domain memory system including
   at least one thin magnetic film capable of supporting magnetic domains; and
   control means operably associated with said film to impart movement to said magnetic domains in said film from one storage position to another storage position;
   said film including at least one defective portion such that magnetic domains cannot be controllably moved or positioned therein, and means on said film for storing information as to locations of defective portions thereon;
   an erasable non-volatile memory element for recording the locations of said defective portions of said film; up-dating means for containing current information as to locations of defective portions on a particular magnetic film;
   said up-dating means being coupled to said erasable non-volatile memory element, and said erasable non-volatile memory element being electrically coupled to said control means for providing signals thereto effective to prevent the use of any defective portions for memory storage; and
   the contents of said erasable non-volatile memory element being erasable for replacement by current information from said up-dating means as to locations of defective portions on a particular magnetic film upon replacement of the magnetic film formerly in use by said particular magnetic film.

3. A magnetic domain memory system including
   at least one thin magnetic film capable of supporting magnetic domains;
   means disposed on said magnetic film for defining a major propagation path on which magnetic domains may be propagated;
   a plurality of minor storage loops adjacent to said major propagation path on which magnetic domains may be propagated in a data processing operation, one or more of said minor storage loops being defective;
   control means operably associated with said film to impart movement to said magnetic domains in said film from one position to another position along said major propagation path and said minor storage loops;
   means for transferring said magnetic domains between said major propagation path and said plurality of minor storage loops;
   means on said film for storing information as to locations of defective minor storage loops thereon;
   an erasable non-volatile memory element for recording the locations of said defective minor storage loops of said film;
   up-dating means for containing current information as to locations of defective minor storage loops on a particular magnetic film, and up-dating means being coupled to said erasable non-volatile memory element, and said erasable non-volatile memory element being electrically coupled to said control means for providing signals thereto effective to prevent the use of any defective minor storage loops for memory storage; and
   the contents of said erasable non-volatile memory element being erasable for replacement by current information from said up-dating means as to locations of defective minor storage loops on a particular magnetic film upon replacement of the magnetic film formerly in use by said particular magnetic film.

4. A magnetic domain memory system as set forth in claim 3, wherein said erasable non-volatile memory element comprises an erasable programmable read-only-memory device.

5. A magnetic domain memory system as set forth in claim 4, wherein said information storing means on said film comprises at least one operable minor storage loop.

6. A magnetic domain memory system as set forth in claim 4, wherein said information storing means on said film comprises a plurality of storage positions respectively located in the same virtual storage positions of each of the operable minor storage loops and providing at least one page of data.

7. A magnetic domain memory system as set forth in claim 4 wherein said up-dating means comprises a volatile random access memory element.

8. A magnetic domain memory system including
   at least one thin magnetic film capable of supporting magnetic domains responsive to a control means for positioning magnetic domains in said film from one storage position to another storage position;
   said film including at least one defective portion such that magnetic domains cannot be controllably moved or positioned therein;
   an erasable non-volatile semiconductor memory element for recording locations of said at least one defective portion;
   a volatile random access memory element coupled to said erasable non-volatile semiconductor memory element for storing and updating locations of said defective portions of said thin magnetic film; and said erasable non-volatile semiconductor memory element being electrically coupled to said control means for providing signals thereto effective to prevent the use of said defective portions for memory storage.

9. A magnetic domain memory system comprising:

a thin magnetic film capable of supporting magnetic domains;

means defining a major path on said magnetic film on which magnetic domains may be propagated;

a plurality of minor storage loops in each of which magnetic domains may be propagated and disposed on said magnetic film adjacent to said major propagation path, one or more of said minor storage loops being inoperable;

means for transferring said magnetic domains between said major propagation path and said minor storage loops;

means on said film for storing information as to the locations of inoperable minor storage loops thereon;

control means operably associated with said film to impart movement to said magnetic domains in said film for propagating said magnetic domains along said major path and said minor storage loops in a data processing operation;

an erasable non-volatile memory element operably associated with said information storing means for recording the locations of said one or more inoperable minor storage loops, and said erasable non-volatile memory element being electrically coupled to said control means for providing signals thereto effective to inhibit the use of any inoperable minor storage loops on said film; and further including a volatile random access memory element for storing and updating locations of said inoperable minor storage loops.

10. A magnetic domain memory system including:

a plurality of magnetic domain data chips, each having a major magnetic domain propagation path means and a plurality of minor loops for propagating magnetic domains, at least one of said minor loops being inoperative for propagating magnetic domains;

control means for propagating magnetic domains around each of said major path means and controlling transfer of data in the form of magnetic domains between said minor loops and said major path means;

an erasable non-volatile semiconductor memory element connected to said control means for recording the locations of said inoperable minor loops in each of said data chips, said erasable non-volatile semiconductor memory element providing data effective to inhibit use of said inoperable minor loops;

an address counter connected to said erasable non-volatile semiconductor memory element for sequentially selecting memory locations;

a volatile random access memory for storing and updating said locations of inoperable minor loops, coupled to said erasable non-volatile semiconductor memory element; and storage means connected to said plurality of data chips and operatively associated with said erasable non-volatile semiconductor memory element for transferring data from operative minor loops in said data chips.

11. A magnetic domain memory system as set forth in claim 10, further including detector means for sensing the presence or absence of magnetic domains and generating means for writing new magnetic domains wherein both generating and detector means are connected to said storage means.

12. A magnetic domain memory system as set forth in claim 10, wherein said storage means comprises a shift register.

13. A method of storing locations of defective areas on a thin magnetic film capable of supporting magnetic domains in a magnetic domain memory system in a non-volatile memory comprising:

replacing those defective magnetic domain memories having more than the allowable number of defective areas on the respective magnetic films thereof, writing the contents of said non-volatile memory element comprising arrays of one bit binary data into a volatile memory element, replacing said defective magnetic domain memory with an operative magnetic domain memory, erasing the contents of said non-volatile memory element, interrogating said replacement magnetic domain memory, updating the addresses of said volatile memory element corresponding to said defective magnetic domain memories with data obtained from said replacement magnetic domain memory, writing the contents of said volatile memory element into said non-volatile memory element, and comparing the contents of said volatile and said non-volatile memory elements until they are equivalent.

14. A method according to claim 13, further comprising storing the locations of the defective areas of said replacement magnetic domain memory thereon.

15. A method according to claim 14, wherein interrogating said replacement magnetic domain memory includes reading the initial data stored thereon which is indicative of the locations of the defective areas of said replacement magnetic domain memory.

* * * * *